US012796127B2

(12) United States Patent
Shirahige

(10) Patent No.: US 12,796,127 B2
(45) Date of Patent: Nov. 10, 2026

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Daiki Shirahige, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 398 days.

(21) Appl. No.: 18/634,287

(22) Filed: Apr. 12, 2024

(65) Prior Publication Data

US 2024/0347560 A1 Oct. 17, 2024

(30) Foreign Application Priority Data

Apr. 17, 2023 (JP) ................................ 2023-067178

(51) Int. Cl.
*H10F 39/00* (2025.01)
*H10F 39/18* (2025.01)

(52) U.S. Cl.
CPC ......... *H10F 39/8027* (2025.01); *H10F 39/18* (2025.01); *H10F 39/8063* (2025.01)

(58) Field of Classification Search
None
See application file for complete search history.

(56) References Cited

U.S. PATENT DOCUMENTS

| | | | | | |
|---|---|---|---|---|---|
| 9,123,603 | B2 * | 9/2015 | Kobayashi | H04N 23/672 | |
| 12,543,392 | B2 * | 2/2026 | Shirahige | H10F 39/18 | |
| 2005/0269604 | A1 * | 12/2005 | Koizumi | H10F 39/803 | 257/E31.038 |
| 2009/0303371 | A1 | 12/2009 | Watanabe | | |
| 2017/0301719 | A1 * | 10/2017 | Iwata | H04N 25/78 | |
| 2018/0308884 | A1 | 10/2018 | Goto | | |
| 2020/0273894 | A1 | 8/2020 | Inui | | |
| 2023/0246048 | A1 * | 8/2023 | Fukuro | H10F 39/024 | 257/435 |

FOREIGN PATENT DOCUMENTS

JP 2023027686 A 3/2023

* cited by examiner

*Primary Examiner* — Michelle Mandala
(74) *Attorney, Agent, or Firm* — Canon U.S.A., Inc. IP Division

(57) ABSTRACT

A photoelectric conversion apparatus includes a first semiconductor region, a second semiconductor region, a third semiconductor region between the first and second semiconductor regions, and a fourth semiconductor region at a depth where the first semiconductor region is arranged and has a lower impurity concentration than an impurity concentration of the first semiconductor region. The photoelectric conversion apparatus includes a transport path that overlaps with the first semiconductor region and the second semiconductor region in a planar view. The fourth semiconductor region overlaps with at least a part of the transport path. In the planar view, the first semiconductor region has a first length and a second length longer than the first length. A virtual line that divides the first semiconductor region into two halves in the first direction and extends in the second direction is arranged so as not to overlap with the transport path.

15 Claims, 11 Drawing Sheets

PHOTOELECTRIC CONVERSION APPARATUS AND PHOTOELECTRIC CONVERSION SYSTEM

BACKGROUND

Technical Field

One disclosed aspect of the embodiments relates to a photoelectric conversion apparatus and a photoelectric conversion system.

Description of the Related Art

Japanese Patent Application Laid-Open No. 2023-27686 discusses a photoelectric conversion apparatus that includes two photoelectric conversion units in one microlens to allow imaging plane phase difference autofocus (AF). According to Japanese Patent Application Laid-Open No. 2023-27686, two impurity regions that serve as the photoelectric conversion unit of each pixel constitute a two-layer structure. Two impurity regions that each form two photoelectric conversion units included in one layer (the deeper layer) are arranged in different directions in one pixel and the other pixel. Meanwhile, two impurity regions that each form two photoelectric conversion units included in the other layer (the shallower layer) are arranged in the same direction in one pixel and the other pixel. A semiconductor region of a second conductivity type is provided to separate the one layer from the other layer. In order to provide a path for transporting signal charges from the one layer to the other layer, the semiconductor region of the second conductivity type for separation is provided with a semiconductor region (a transport path) of the second conductivity type with a lower impurity concentration.

Japanese Patent Application Laid-Open No. 2023-27686 also discusses that a potential well is generated in a charge accumulation region corresponding to the transport path, reducing the transfer performance, so that a second conductivity type impurity may be implanted into the charge accumulation region corresponding to the transport path.

Japanese Patent Application Laid-Open No. 2023-27686 further discusses that the second conductivity type impurity is also implanted into the other layer in forming the semiconductor region of the second conductivity type for separating the semiconductor regions in the one layer, generating a potential well in a charge accumulation region in the other layer, reducing the transfer performance. Further, Japanese Patent Application Laid-Open No. 2023-27686 discusses that the second conductivity type impurity is also implanted into the periphery of the region where a potential well will be generated.

However, as discussed in Japanese Patent Application Laid-Open No. 2023-27686, a second conductivity type (e.g., P-type) impurity region formed partially on the transport path to reduce a potential well can obstruct the movement of signal charges, reducing the transfer characteristic.

SUMMARY

An aspect of the embodiments is directed to the provision of a technique for further improving the transfer efficiency of signal charges in a photoelectric conversion apparatus.

According to an aspect of the disclosure, a photoelectric conversion apparatus includes a semiconductor layer, at least one first semiconductor region of a first conductivity type, at least one second semiconductor region of the first conductivity type, a third semiconductor region of a second conductivity type, a fourth semiconductor region of the first conductivity type, and a transport path. The semiconductor layer includes a first surface and a second surface on an opposite side of the first surface. The at least one first semiconductor region is provided between the first surface and the second surface. The at least one second semiconductor region is provided between the at least one first semiconductor region and the second surface. The second conductivity type is a conductivity type opposite to the first conductivity type. The third semiconductor is provided between the at least one first semiconductor region and the at least one second semiconductor region. The fourth semiconductor region is provided at a depth where the at least one first semiconductor region is arranged and has a lower impurity concentration than an impurity concentration of the at least one first semiconductor region. The transport path is configured to overlap with the at least one first semiconductor region and the at least one second semiconductor region in a planar view and to transport a signal charge generated in the at least one second semiconductor region to the at least one first semiconductor region. In the planar view, the fourth semiconductor region overlaps with at least a part of the transport path. In the planar view, the at least one first semiconductor region has a first length in a first direction and a second length longer than the first length in a second direction perpendicular to the first direction. In the planar view, a virtual line that divides the at least one first semiconductor region into two halves in the first direction and extends in the second direction is arranged so as not to overlap with the transport path.

Further features of the disclosure will become apparent from the following description of exemplary embodiments with reference to the attached drawings.

DESCRIPTION OF THE EMBODIMENTS

Exemplary embodiments described below are examples for embodying the technical scope of the disclosure and do not limit the disclosure. Sizes and positional relationships of members illustrated in the individual drawings may be exaggerated for clarity of description. In the following descriptions, like numbers refer to like components, and the redundant descriptions thereof may be omitted.

In the exemplary embodiments described below, a signal charge will be described as an electron. Thus, a semiconductor region of which majority carriers are charges of the same conductivity type as that of the signal charge (a semiconductor region of a first conductivity type) is an N-type semiconductor region. Further, a semiconductor region of which majority carriers are charges of the conductivity type different from that of the signal charge (a semiconductor region of a second conductivity type) is a P-type semiconductor region. If the signal charge is a hole, the semiconductor region of the first conductivity type is a P-type semiconductor region, and the semiconductor region of the second conductivity type is an N-type semiconductor region.

In this specification, a "planar view" is a two-dimensional plan view obtained by projecting each constituent member onto a plane parallel to the upper surface of a semiconductor layer.

In this specification, an "impurity concentration" means that a net impurity concentration obtained by subtracting an amount offset by an impurity of an opposite conductivity type. The region where a P-type additive impurity concentration is higher than an N-type additive impurity concentration is a P-type semiconductor region, and the region where the N-type additive impurity concentration is higher than the P-type additive impurity concentration is an N-type semiconductor region.

A photoelectric conversion apparatus according to a first exemplary embodiment will be described with reference to FIGS. 1 to 5A and 5B.

Figure 1:
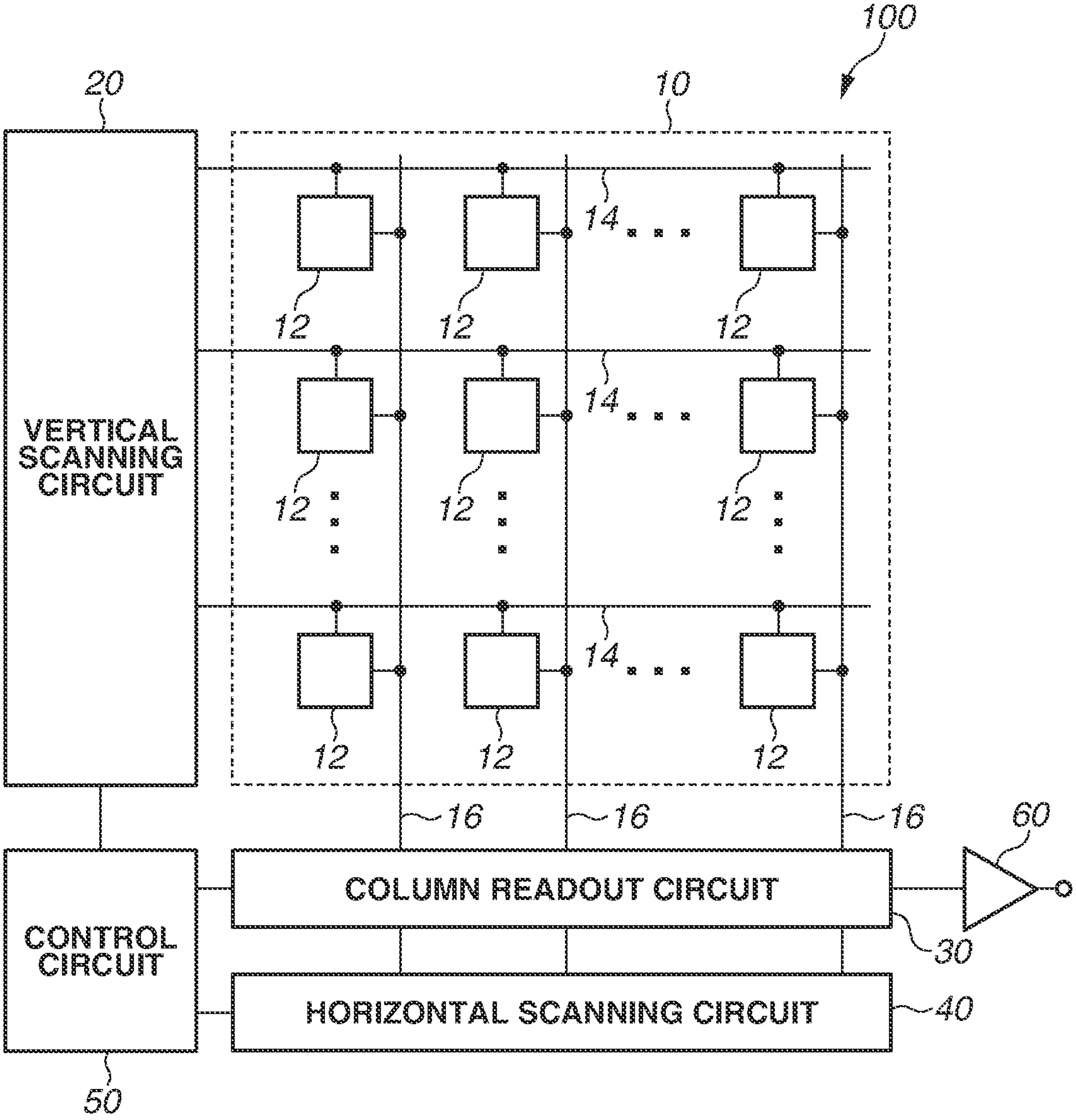
FIG. 1 is a block diagram schematically illustrating the configuration of a photoelectric conversion apparatus according to a first exemplary embodiment.
Figure 2A:
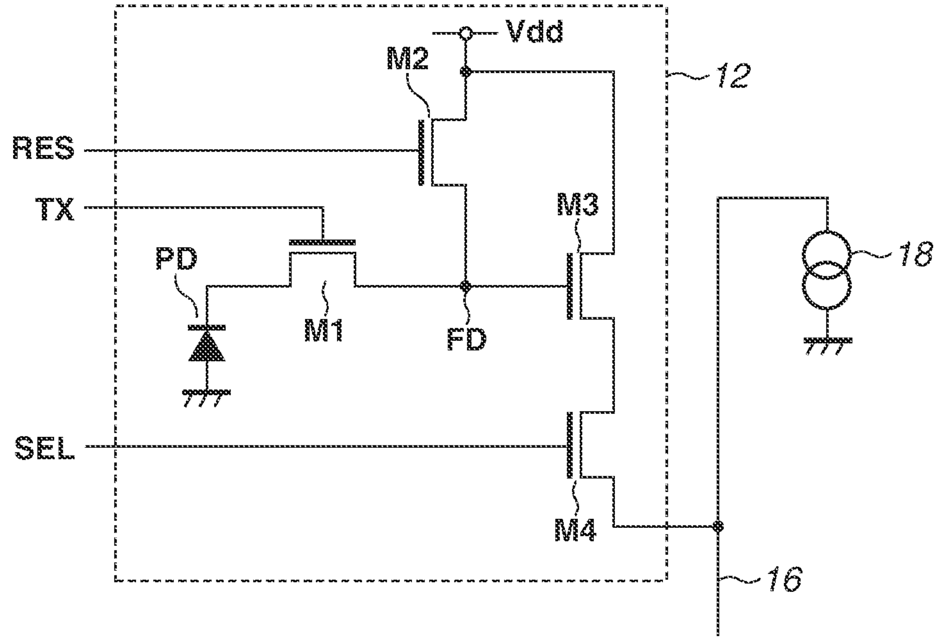
FIGS. 2A and 2B are equivalent circuit diagrams of pixels in the photoelectric conversion apparatus according to the first exemplary embodiment.
Figure 2B:
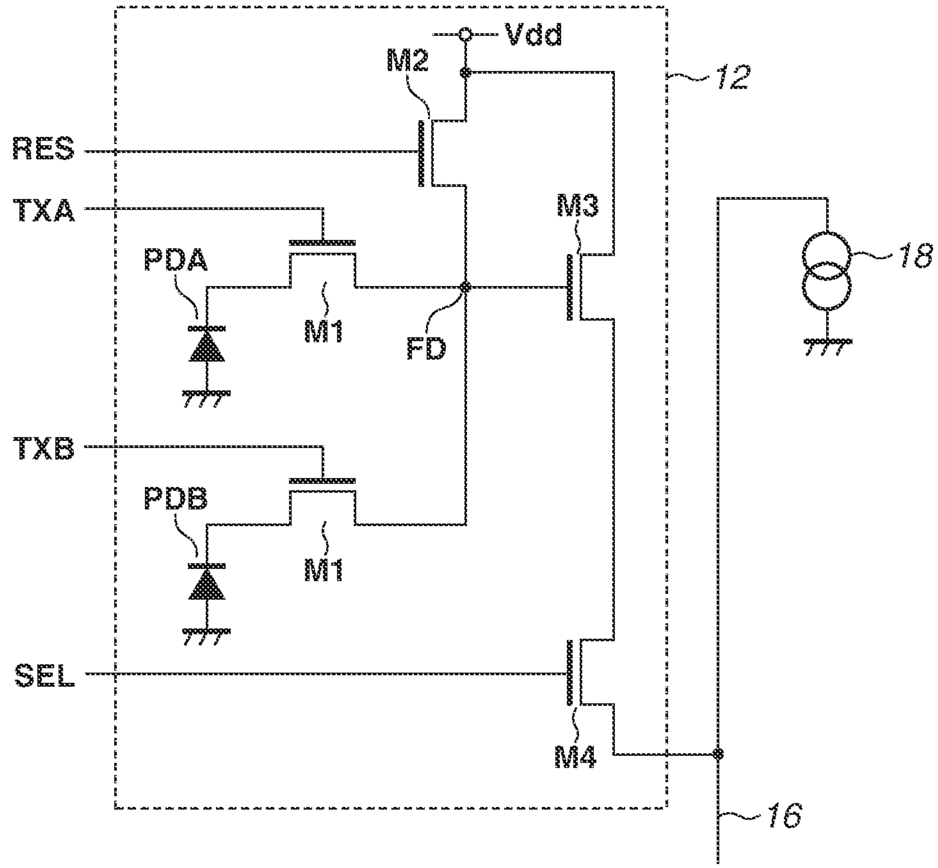
Figure 3A:
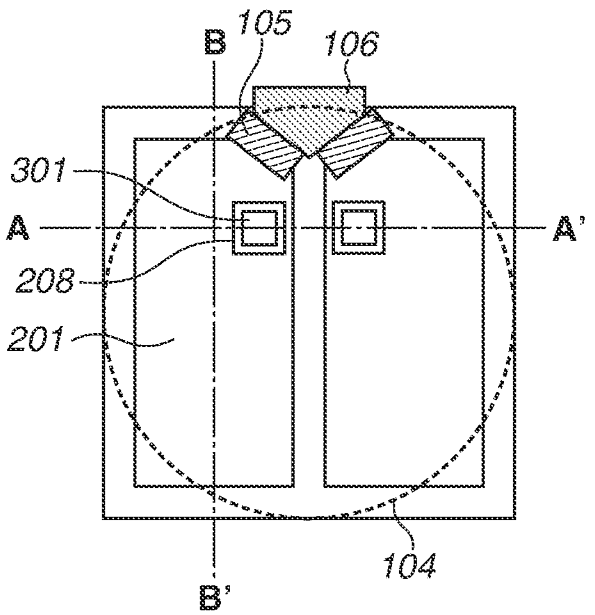
FIGS. 3A to 3C are a plan view and cross-sectional views of pixels in the photoelectric conversion apparatus according to the first exemplary embodiment.
Figure 3B:
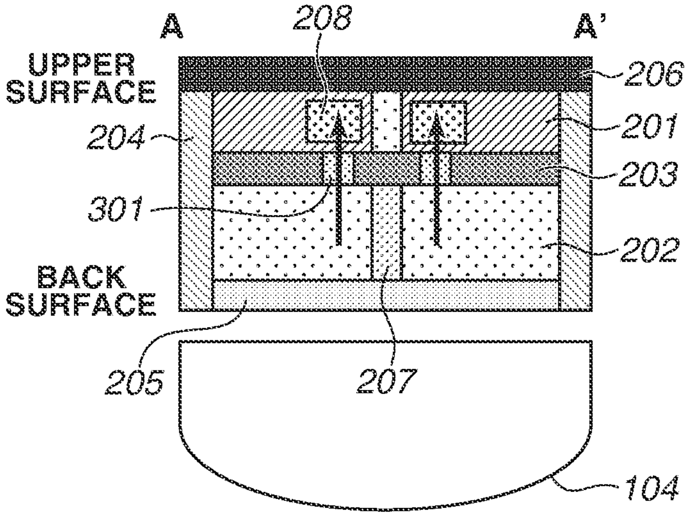
Figure 3C:
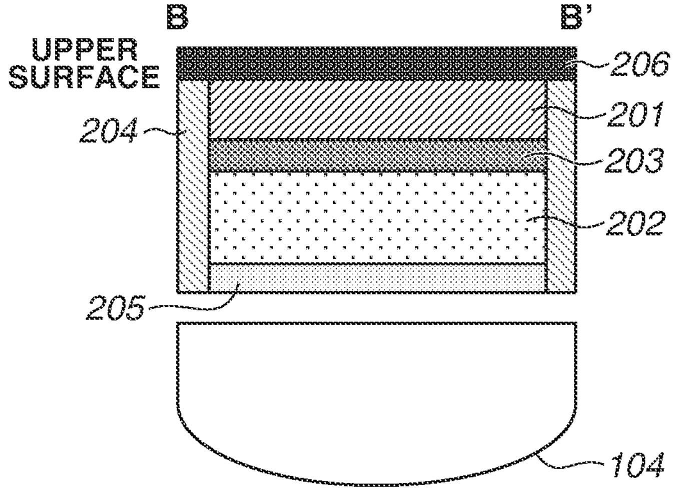
Figure 4A:
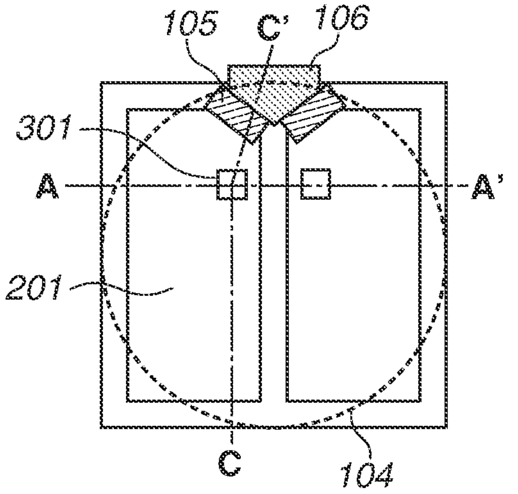
FIGS. 4A to 4F are layout diagrams and potential graphs of pixels in a photoelectric conversion apparatus according to a comparative example and the first exemplary embodiment.
Figure 4B:
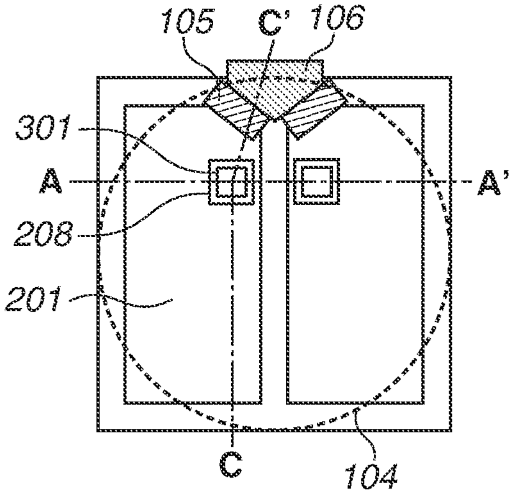
Figure 4C:
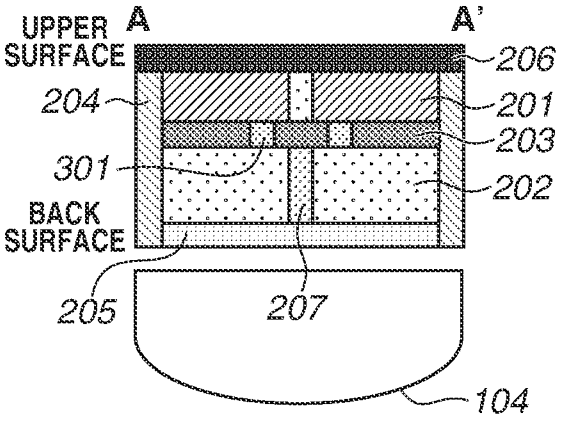
Figure 4D:
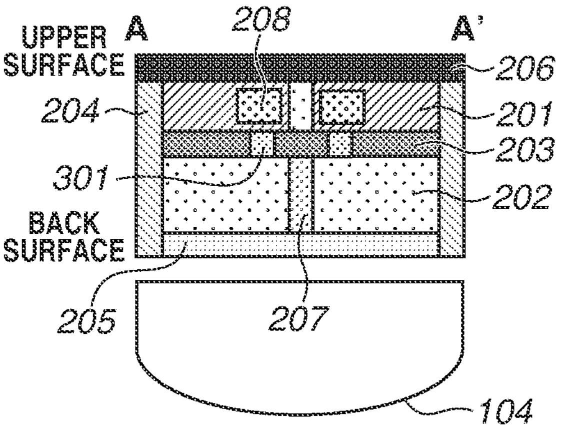
Figure 4E:
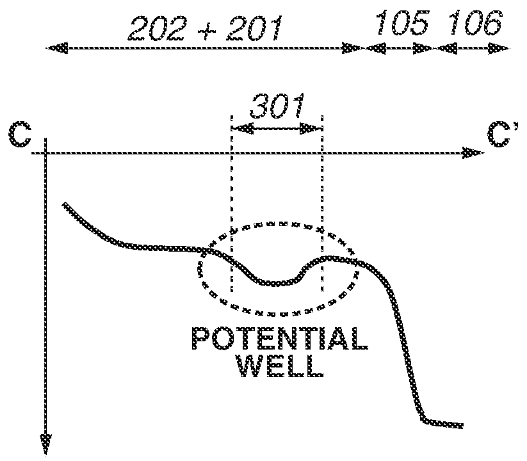
Figure 4F:
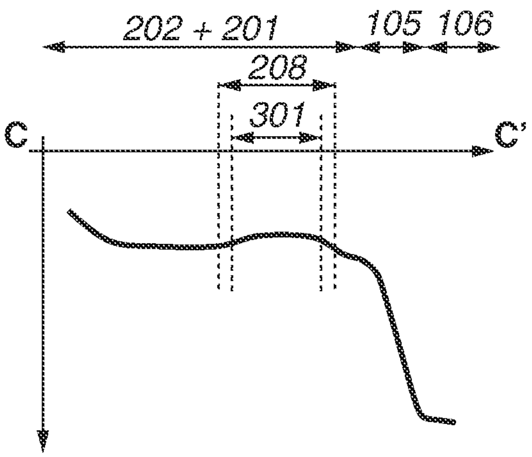
Figure 5A:
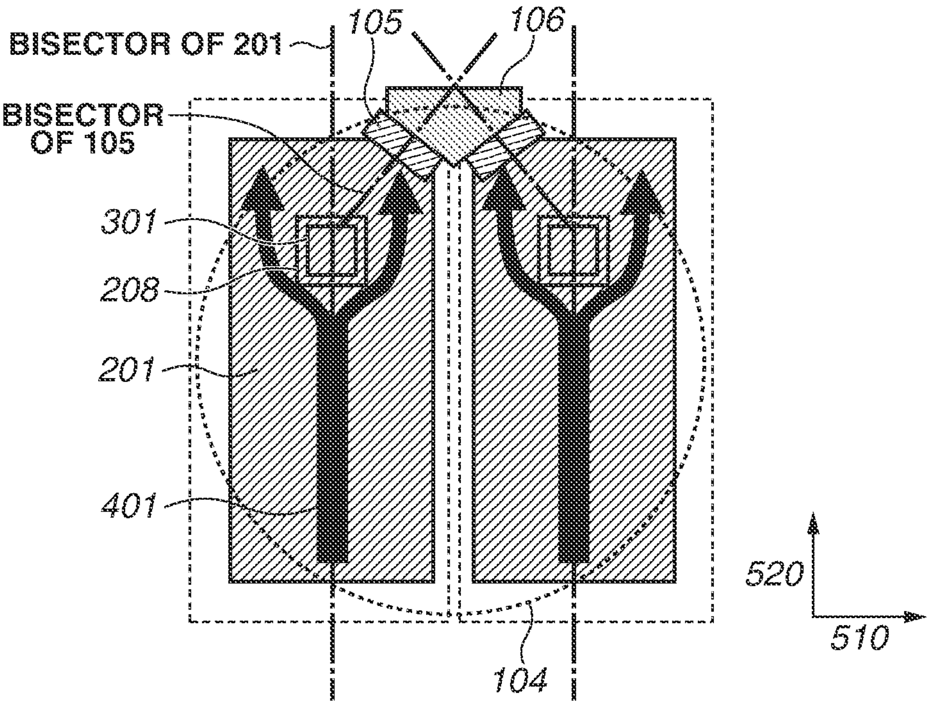
FIGS. 5A and 5B are schematic plan views of pixels in the photoelectric conversion apparatus according to the comparative example and the first exemplary embodiment.
Figure 5B:
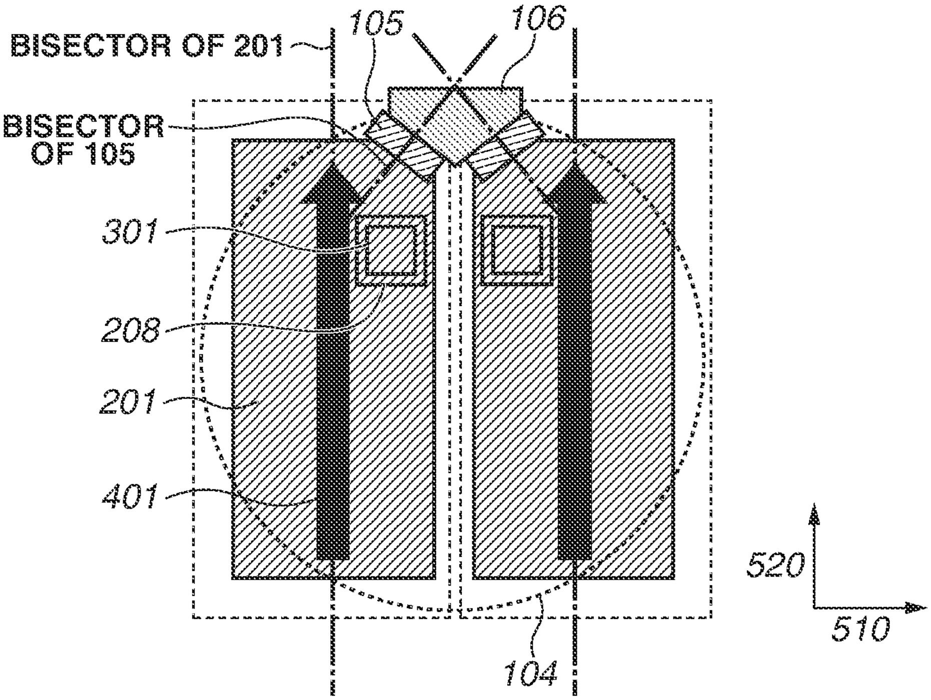

FIG. 1 is a block diagram schematically illustrating a configuration of the photoelectric conversion apparatus according to the present exemplary embodiment. FIGS. 2A and 2B are equivalent circuit diagrams of pixels in the photoelectric conversion apparatus according to the present exemplary embodiment. FIGS. 3A to 3C illustrate a planar layout and cross sections of pixels in the photoelectric conversion apparatus according to the present exemplary embodiment. FIGS. 4A to 4F illustrate pixel layouts and potential graphs of the photoelectric conversion apparatus according to the present exemplary embodiment. FIGS. 5A and 5B illustrate planar layouts of pixels in the photoelectric conversion apparatus according to the present exemplary embodiment.

A photoelectric conversion apparatus 100 according to the present exemplary embodiment includes a pixel region 10, a vertical scanning circuit 20, a column readout circuit 30, a horizontal scanning circuit 40, a control circuit 50, and an output circuit 60 as illustrated in FIG. 1.

The pixel region 10 includes a plurality of pixels 12 arranged in a matrix across a plurality of rows and columns. Control signal lines 14 are arranged extending in the row direction (horizontal direction in FIG. 1) along each row of the pixel array in the pixel region 10. One control signal line 14 is connected to each of the corresponding pixels 12 arranged in the row direction and serves as a common signal line between the corresponding pixels 12. Further, vertical output lines 16 are arranged extending in the column direction (vertical direction in FIG. 1) along each column of the pixel array in the pixel region 10. One vertical output line 16 is connected to each of the corresponding pixels 12 arranged in the column direction and serves as a common signal line between the corresponding pixels 12.

The control signal line 14 in each row is connected to the vertical scanning circuit 20. The vertical scanning circuit 20 is a circuit unit that supplies a control signal for driving a readout circuit in each pixel 12 in reading out a pixel signal from the pixel 12, to the pixel 12 via the control signal line 14. One end of the vertical output line 16 of each column is connected to the column readout circuit 30. The pixel signal read out from the pixel 12 is input to the column readout circuit 30 via the corresponding vertical output line 16. The column readout circuit 30 is a circuit unit that performs predetermined signal processing, such as amplification processing and analog-to-digital (AD) conversion processing, on the pixel signal read out from the pixel 12. The column readout circuit 30 can include a differential amplifier circuit, a sample-and-hold circuit, and an AD conversion circuit.

The horizontal scanning circuit 40 is a circuit unit that supplies the column readout circuit 30 with a control signal for sequentially transferring the pixel signal processed in the column readout circuit 30 to the output circuit 60 for each column. The control circuit 50 is a circuit unit that supplies control signals for controlling operations and timings of the operations of the vertical scanning circuit 20, the column readout circuit 30, and the horizontal scanning circuit 40. The output circuit 60 is a circuit unit that includes a buffer amplifier and a differential amplifier and outputs the pixel signal read out from the column readout circuit 30 to a signal processing unit outside the photoelectric conversion apparatus 100.

Each pixel 12 includes a pixel circuit as an equivalent circuit illustrated in FIG. 2A. More specifically, each pixel 12 includes a photoelectric conversion unit PD, a transfer transistor M1, a reset transistor M2, an amplification transistor M3, and a selection transistor M4. The photoelectric conversion unit PD is, for example, a photodiode, and has an anode connected to a ground voltage line and a cathode connected to the source of the transfer transistor M1. The drain of the transfer transistor M1 is connected to the source of the reset transistor M2 and the gate of the amplification transistor M3.

The connection node of the drain of the transfer transistor M1, the source of the reset transistor M2, and the gate of the amplification transistor M3 is a floating diffusion (FD) and forms a charge-voltage conversion portion composed of a capacitance component included in the connection node. The drain of the reset transistor M2 and the drain of the amplification transistor M3 are connected to a power supply voltage line (Vdd). The source of the amplification transistor M3 is connected to the drain of the selection transistor M4. The source of the selection transistor M4 is connected to the vertical output line 16. The other end of the vertical output line 16 is connected to a current source 18.

In a circuit configuration illustrated in FIGS. 2A and 2B, the control signal lines 14 include a transfer gate signal line TX, a reset signal line RES, and a selection signal line SEL. The transfer gate signal line TX is connected to the gate of the transfer transistor M1. The reset signal line RES is connected to the gate of the reset transistor M2. The selection signal line SEL is connected to the gate of the selection transistor M4.

The photoelectric conversion unit PD converts incident light into an amount of charge corresponding to the amount of the light (photoelectric conversion) and accumulates the generated charge. With the transfer transistor M1 turned on, the charge of the photoelectric conversion unit PD is transferred to the floating diffusion FD. The floating diffusion FD has a voltage that corresponds to the amount of charge transferred from the photoelectric conversion unit PD through charge-voltage conversion with its capacitance. The amplification transistor M3 has a drain supplied with the power supply voltage Vdd and a source supplied with a bias current from the current source 18 via the selection transistor M4, forming an amplification portion (source follower circuit) with the gate as an input node. In this way, the amplification transistor M3 outputs a signal based on the voltage of the floating diffusion FD to the corresponding vertical output line 16 via the selection transistor M4. With the reset transistor M2 turned on, the floating diffusion FD is reset to a voltage corresponding to the power supply voltage Vdd.

FIG. 2B illustrates a configuration in which a photoelectric conversion unit PDA and a photoelectric conversion unit PDB share the reset transistor M2, the amplification transistor M3, and the selection transistor M4. The pixel circuit is shared in this way, allowing the area of the pixel circuit to be reduced, enabling the photoelectric conversion unit PD to occupy a larger area. In addition, a microlens common to the photoelectric conversion unit PDA and the photoelectric conversion unit PDB can be used as a pixel for detecting a phase different. More specifically, a signal supplied to the transfer gate signal line TXA allows a signal (A signal) from the photoelectric conversion unit PDA to be read out. Further, a signal supplied to the transfer gate signal line TXB after resetting the voltage of the floating diffusion FD allows a signal (B signal) from the photoelectric conversion unit PDB to be read out. Comparison between the A and B signals allows phase difference information to be obtained. Further, a combination of the A and B signals allows imaging information to be obtained. Further, with the A signal and the A+B signal that are read out without resetting the voltage of the floating diffusion FD, phase difference information and imaging information may be obtained.

FIG. 3A is a plan view of the pixel 12 described with reference to FIG. 2B, and FIGS. 3B and 3C are schematic cross-sectional views. FIG. 3B is a cross-sectional view taken along a line A-A' in FIG. 3A, and FIG. 3C is a cross-sectional view taken along a line B-B' in FIG. 3A. In FIG. 3A, only the main components are illustrated, and some components are omitted.

In FIG. 3A, a configuration is employed in which signal charges are transferred from two semiconductor regions 201 to the FD as one diffusion region. A reduced capacitance of the FD improves the charge-voltage conversion efficiency. Thus, a transfer gate 105 may be provided at a corner of each first semiconductor region 201, for example, not at a side but at a corner of the first semiconductor region 201 having a substantially rectangular form.

In FIG. 3B, an upper semiconductor layer is referred to as an upper surface (a first surface), and an opposite surface is referred to as a back surface (a second surface). Although it is not illustrated, a transistor and a wiring structure are provided nearer the upper surface of the semiconductor layer. According to the present exemplary embodiment, a back surface illuminated type is employed, and the back surface illuminated type has a structure in which light enters the back surface of the semiconductor layer. The incident light passes through a microlens 104 (the outer edge of the microlens is indicated by a dotted line) and enters the photoelectric conversion unit. Although it is not illustrated, a color filter or a partition wall arranged between color filters may also be provided.

The photoelectric conversion unit constitutes a positive-to-negative (PN) junction diode, and as illustrated in FIG. 3B, the photoelectric conversion unit includes the semiconductor region 201 of the first conductivity type (a first semiconductor region) and semiconductor region 202 of the first conductivity type (a second semiconductor region). More specifically, the semiconductor region 201 are provided between the upper surface (first surface) and the back surface (second surface), and the semiconductor region 202 is provided between the semiconductor region 201 and the back surface (second surface). A semiconductor region 203 of the second conductivity type (a third semiconductor region) is provided between the semiconductor region 201 and the semiconductor region 202 to separate these semiconductor regions.

The semiconductor region 201 and the semiconductor region 202 are separated by the third semiconductor region 203, but they are not completely separated and are connected via transport path 301. Thus, signal charges can be transported from semiconductor region 202 to the semiconductor region 201. The transport path 301 is a path for transporting signal charges and thus is configured to overlap with the corresponding semiconductor region 201 and the corresponding semiconductor region 202 in the planar view as illustrated in FIG. 3A.

For example, in the case of using an epitaxial substrate of the first conductivity type, the transport path 301 can be formed by providing a region in which in implanting a second conductivity type impurity into the semiconductor region 203, the impurity is not implanted. Further, even in a case where the semiconductor region 203 is formed by implanting the second conductivity type impurity over the entire region, the transport paths 301 can be formed by additionally implanting a first conductivity type impurity in positions where the transport path 301 is provided. The transport path 301 can be a semiconductor region of the first conductivity type with a lower impurity concentration than the impurity concentration of the first semiconductor region. Further, the transport path 301 may be a semiconductor region of the second conductivity type having a lower impurity concentration than the impurity concentration of the third semiconductor region 203 of the second conductivity type. Furthermore, as long as each transport path 301 can transport signal charges from the corresponding semiconductor region 202 to the corresponding semiconductor region 201, it is sufficient that a potential gradient is formed in the transport path 301. Thus, the transport paths 301 may be composed of both the semiconductor region of the first conductivity type and the semiconductor region of the second conductivity type.

A semiconductor region 204 of the second conductivity type is provided to separate the pixel from the others. Further, a semiconductor region 205 of the second conductivity type is provided a side of the back surface of the semiconductor layer, and a semiconductor region 206 of the second conductivity type is provided a side of the upper surface of the semiconductor layer. Instead, a configuration can be employed in which a negative fixed charge film is provided on the upper surface of the semiconductor layer without providing the semiconductor region 206 a side of the upper surface.

In the implanting process of the second conductivity type impurity in forming the semiconductor region 203, the second conductivity type impurity may be implanted into and/or nearer the upper surface of the semiconductor layer due to, for example, a reduced implanting energy caused by the impurity hitting a mask, such as a resist. Thus, the second conductivity type impurity is implanted into a region where each semiconductor region 201 overlaps with the corresponding semiconductor region 203 in the planar view. As a result, a difference in potential height is generated between the semiconductor region 201 that overlaps with the semiconductor region 203 and the semiconductor region 201 that does not overlap with the semiconductor region 203. This provides a potential well formed in the semiconductor region 201 that does not overlap with the semiconductor region 203. A signal charge moving in the semiconductor region 201 is likely trapped in the potential well, resulting in a reduction in efficiency of the transfer of the signal charge to an FD 106 from the semiconductor region 201 and the semiconductor region 202 by the transfer gate 105.

Thus, the second conductivity type impurity is implanted into a depth where each semiconductor region 201 is arranged to form a corresponding semiconductor region 208 (a fourth semiconductor region). The semiconductor region 201 has a high impurity concentration. Thus, even if the second conductivity type impurity is implanted, not all the first conductivity type impurity implanted into the semiconductor region 201 is offset, so that each semiconductor region 208 remains as the semiconductor region of the first conductivity type. However, the impurity concentration of the semiconductor region 208 becomes lower than the impurity concentration of the semiconductor region 201. In the planar view, each semiconductor region 208 overlaps with at least a part of the corresponding transport path 301. Consequently, the potential of the semiconductor region 201 that overlaps with the corresponding transport path 301, which can be a potential well for signal charges, becomes high, preventing reduction in the transfer efficiency.

The potential well will now be described with reference to FIGS. 4A to 4F. FIGS. 4A, 4C, and 4E illustrate a comparative example, and FIGS. 4B, 4D, and 4F illustrate the present exemplary embodiment. FIGS. 4C and 4D are cross-sectional views taken along lines A-A in FIGS. 4A and 4B, respectively. FIGS. 4E and 4F each illustrate potential with respect to a signal charge along the depth of the semiconductor region 201 in C-C' cross sections in FIGS. 4A and 4B, respectively. The C-C' cross section includes a path from each semiconductor region 202 via the corresponding semiconductor region 201 overlapping with the corresponding transport path 301 in the planar view through the corresponding transfer gate 105 to the FD 106.

FIG. 4E illustrates the potential without the semiconductor region 208, and the potential has a potential well generated in each semiconductor region 201 overlapping with the corresponding transport path 301 in the planar view. On the other hand, FIG. 4F illustrates the potential with each semiconductor region 208 arranged at a position where overlaps with the corresponding transport path 301, and the potential has a reduced potential well.

FIGS. 5A and 5B are plan views regarding movement paths of signal charges. FIG. 5A illustrates a comparative example, and FIG. 5B illustrates the present exemplary embodiment. Each semiconductor region 201 has a first length in a first direction 510 and a second length in a second direction 520 perpendicular to the first direction 510, and the length in the second direction 520 is longer than the length in the first direction 510. According to the present exemplary embodiment, one microlens 104 is provided in common to the two semiconductor regions 201, and the first direction 510 can also be described as a direction in which the two semiconductor regions 201 are adjacent to each other.

A "bisector of region 201" in FIGS. 5A and 5B is a virtual line that divides the length of each semiconductor region 201 in the first direction 510 into two halves and extends in the second direction 520. In other words, the "bisector of region 201" is a virtual line that divides the length of each semiconductor region 201 in the minor axis direction into two halves and extends in the major axis direction. The bisector of each semiconductor region 201 means a path that occupies most of the path in the movement direction of signal charges.

Further, a "bisector of transfer gate 105" in FIGS. 5A and 5B is a virtual line that divides the length of each transfer gate 105 in its channel width direction into two halves and extends in a direction perpendicular to the channel width direction. In other words, the "bisector of transfer gate 105" is a virtual line that divides the length of each transfer gate 105 in the major axis direction into two halves and extends in the minor axis direction perpendicular to the major axis direction. Since each transfer gate 105 is provided tilted at a corner of the corresponding semiconductor region 201, the "bisector of region 201" and the "bisector of transfer gate 105" intersect one another.

The signal charge accumulated in each semiconductor region 201 is transferred in the direction of the FD 106 in response to when the corresponding transfer gate 105 is turned on. At this time, the movement path of a signal charge is changed depending on the potential with respect to the signal charge in the semiconductor region 201. FIG. 5A illustrates an example in which each transport path 301 and the corresponding semiconductor region 208 are arranged on the bisector of the corresponding semiconductor region 201, and a signal charge movement path 401.

As illustrated in FIG. 5A as the comparative example, although the signal charge movement path 401 in each semiconductor region 201 runs in the direction of the FD 106, the signal charge movement path 401 goes around the corresponding semiconductor region 208 and runs in the direction of the FD 106, so that the transfer characteristic tends to be lower.

On the other hand, in FIG. 5B illustrating the present exemplary embodiment, both each transport path 301 and the corresponding semiconductor region 208 are arranged so as not to overlap the bisector of the corresponding semiconductor region 201 in the planar view.

Thus, it is unlikely that the movement of charges is not obstructed by the corresponding semiconductor region 208, preventing reduction in the transfer characteristic. As described above, the configuration according to the present exemplary embodiment allows the reduction of a potential well due to the transport paths 301, the obstruction of the charge movement path by the semiconductor region 208, improving the transfer characteristic.

As described above, according to the present exemplary embodiment, an example has been described in which both each transport path 301 and the corresponding semiconductor region 208 are arranged so as not to overlap the bisector of the corresponding semiconductor region 201 in the planar view. However, even if the bisector of each semiconductor region 201 and the corresponding semiconductor region 208 overlap in the planar view, the effect of improving the transfer characteristic can be achieved. For example, a case can be assumed in which each semiconductor region 208 is made larger in area than the corresponding transport path 301 for the purpose of reducing the potential well. In this case, the bisector of each semiconductor region 201 overlaps with the outer perimeter of the corresponding semiconductor region 208 in the planar view. On the other hand, the semiconductor region 203 is a cause of generating a potential well in the semiconductor region 201 that overlaps with the corresponding transport path 301. Thus, a configuration in which each semiconductor region 208 overlaps with the corresponding transport path 301 in the planar view is necessary to achieve the effect of improving the transfer characteristic.

As described above, in forming the transport paths 301, it can be conceivable to form the semiconductor region 203 of the second conductivity type over the entire region and additionally implant the first conductivity type impurity into a region where each transport path 301 is formed. In this case as well, there is a possibility that the first conductivity type impurity is also implanted into the semiconductor region 201 that each overlap with the corresponding transport path 301 in the implanting process of the first conductivity type impurity. In this case as well, a difference in potential height is generated between the semiconductor region 201 that overlaps with the semiconductor region 203 and the semiconductor region 201 that does not overlap with the semiconductor region 203. Thus, a potential well is formed in the semiconductor region 201 that does not overlap with the semiconductor region 203, making a signal charge moving in the semiconductor region 201 likely to be trapped in the potential well, resulting in a reduction in the efficiency of the transfer of the signal charge to the FD 106 from the semiconductor region 201 and the semiconductor region 202 by the transfer gate 105. Thus, the configuration described above can also be applied to this example.

A photoelectrically converted signal charge moves from the corresponding semiconductor region 202 via the corresponding transport path 301 to the corresponding semiconductor region 201, so that the charge movement path is determined by the position of the transport path 301. Thus, if the transport path 301 is arranged in a region away from the corresponding transfer gate 105, it takes time for charges to move. In order to transfer charges more efficiently from each semiconductor region 202 via the corresponding semiconductor region 201 to the FD 106, the corresponding transport path 301 may be arranged in a region near the corresponding transfer gate 105. Thus, as illustrated in FIG. 5B, it is desirable to arrange the transport path 301 and the corresponding semiconductor region 208 on the side of the corresponding transfer gate 105 arranged in the corresponding semiconductor region 201 divided by the bisector of the semiconductor region 201.

As illustrated in FIG. 5B, both each transport path 301 and the corresponding semiconductor region 208 are arranged so as not to overlap with the bisector of the corresponding transfer gate 105 in the planar view. A signal charge moves via the transfer gate 105 to the FD 106. More specifically, the signal charge moves along the bisector of the transfer gate 105. Thus, the arrangement of both the transport path 301 and the semiconductor region 208 so as not to overlap with the bisector of the transfer gate 105 in the planar view can improve the transfer characteristic. Further, in the planar view, as long as the transport path 301 is arranged so as not to overlap with the bisector of the transfer gate 105, the semiconductor region 208 can be arranged to overlap with the bisector of the transfer gate 105.

According to the above-described exemplary embodiment, the example has been described in which two photoelectric conversion units are provided with one microlens. This configuration provides both phase difference detection and imaging functions. In this configuration, a semiconductor region 207 may be provided to separate the two semiconductor regions 201 or the two semiconductor regions 202 from each other as illustrated in FIG. 3B.

Further, although it is not illustrated, the present exemplary embodiment can be applied to a case where one photoelectric conversion unit is provided for one microlens.

Figure 6A:
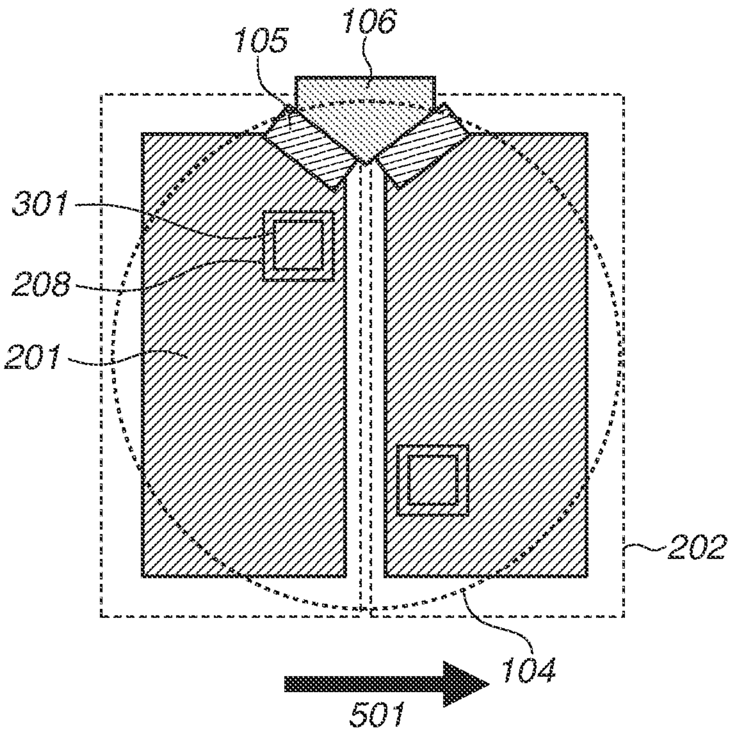
FIGS. 6A and 6B are plan views of pixels in a photoelectric conversion apparatus according to a second exemplary embodiment.
Figure 6B:
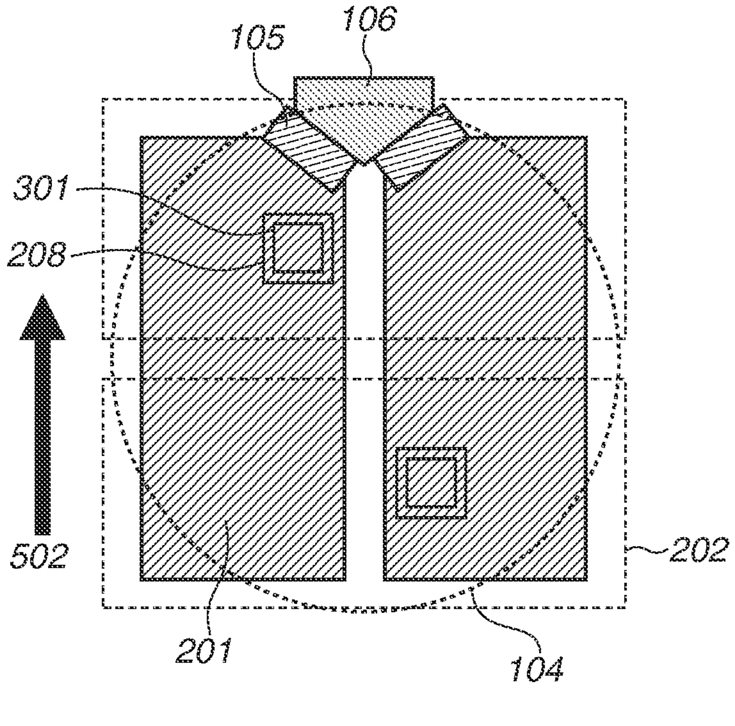

A second exemplary embodiment will be described with reference to FIGS. 6A and 6B, 7A to 7C, 8A to 8D, and 9A and 9B. The present exemplary embodiment is different in arrangement direction of the semiconductor regions 202 from the first exemplary embodiment. In FIGS. 6A and 6B, the arrangement direction of the semiconductor regions 201 is the same, but the arrangement direction of the semiconductor regions 202 is different. More specifically, FIG. 6A is an example of arranging the two semiconductor regions 202 in the same direction as doing the semiconductor region 201. On the other hand, in FIG. 6B, the two semiconductor regions 202 are arranged in a direction rotated by 90 degrees with respect to the arrangement direction of the semiconductor region 201. In FIG. 6A, the arrangement direction of the semiconductor regions 202 is an arrangement direction 501. In FIG. 6B, the arrangement direction of the semiconductor regions 202 is an arrangement direction 502.

Figure 7A:
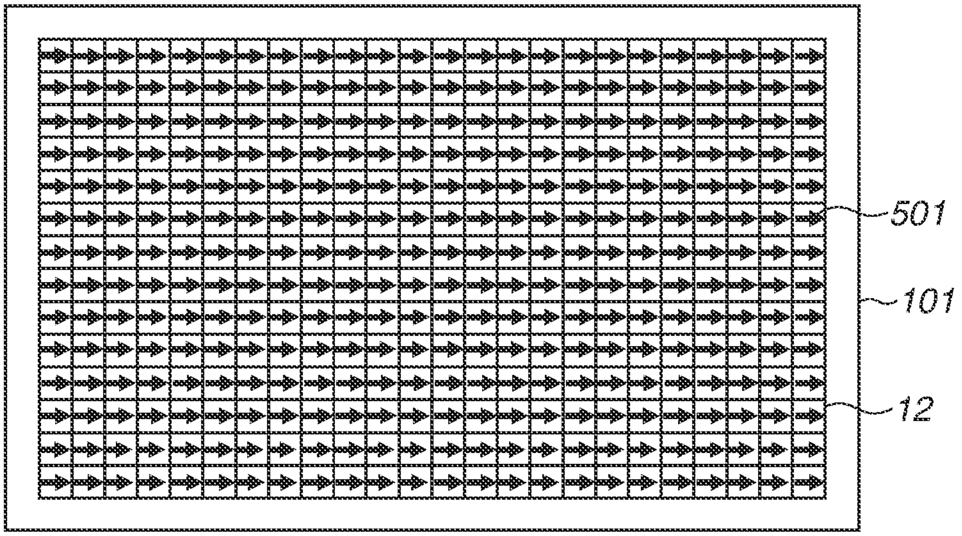
FIGS. 7A to 7C are schematic plan views of the photoelectric conversion apparatus according to the second exemplary embodiment.
Figure 7B:
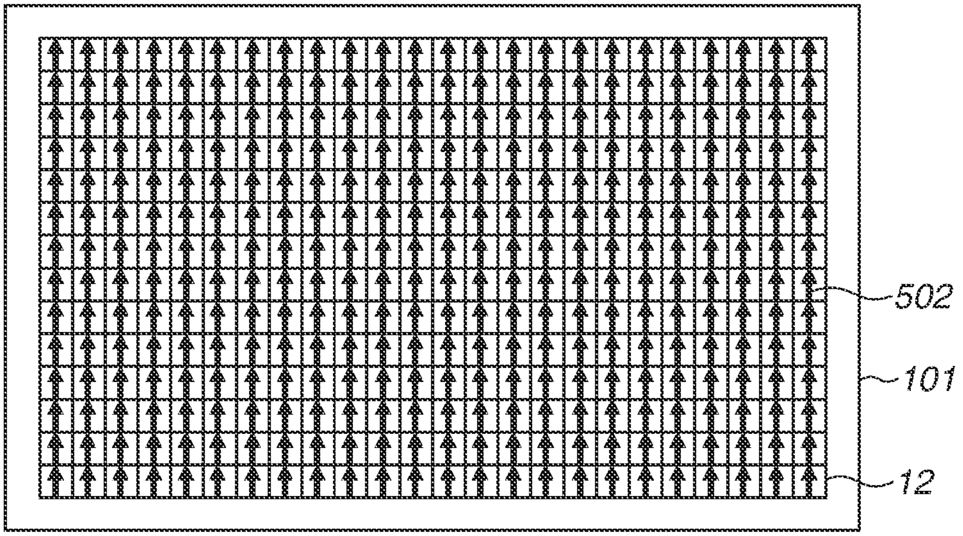
Figure 7C:
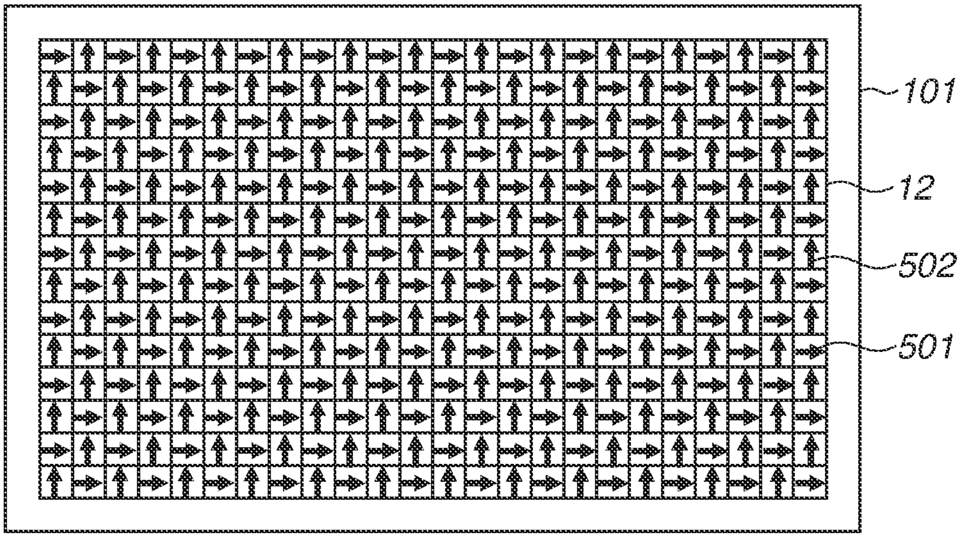

FIG. 7A illustrates an example in which the arrangement directions of the semiconductor regions 201 and the semiconductor regions 202 are the same as described according to the first exemplary embodiment. More specifically, FIG. 7A illustrates an example of a photoelectric conversion apparatus 101 in which the pixels 12 in the arrangement direction 501 are arranged in an array. FIG. 7B illustrates the photoelectric conversion apparatus 101 in which the pixels 12 in the arrangement direction 502 are arranged in an array. Further, FIG. 7C illustrates the photoelectric conversion apparatus 101 in which the pixels 12 mixed in the arrangement direction 501 and in the arrangement direction 502 are arranged in an array.

The direction in which the photoelectric conversion apparatus 101 can detect a phase difference is determined based on the arrangement direction of the semiconductor regions 202. For example, the arrangement in the arrangement direction 501 facilitates detection of a phase difference if an object has a contrast in the horizontal direction, but the arrangement provides a lower accuracy of a phase difference detection if an object has a contrast in the vertical direction. On the other hand, the arrangement in the arrangement direction 502 facilitates detection of a phase difference if an object has a contrast in the vertical direction, but the arrangement provides a lower accuracy of a phase difference detection if an object has a contrast in the horizontal direction.

The accuracy of a phase difference detection affects the speed and the accuracy in performing imaging plane phase difference autofocus, resulting in a demand for a photoelectric conversion apparatus provided with a high phase difference detection accuracy regardless of object conditions. The configuration illustrated in FIG. 7C allows an accurate detection of a phase difference of an object having a vertical or horizontal contrast.

Figure 8A:
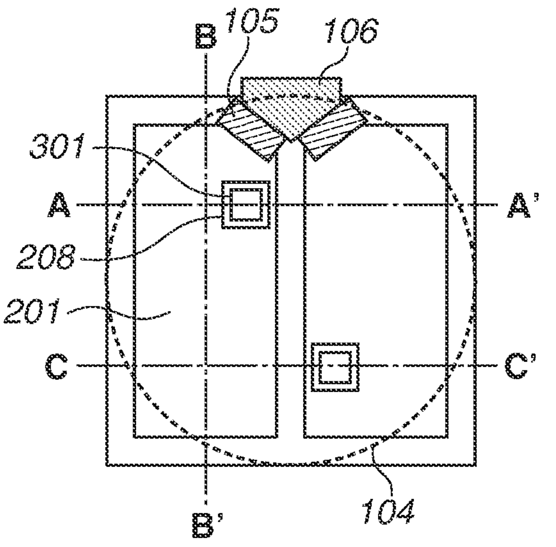
FIGS. 8A to 8D are a plan view and cross-sectional views of pixels in the photoelectric conversion apparatus according to the second exemplary embodiment.
Figure 8B:
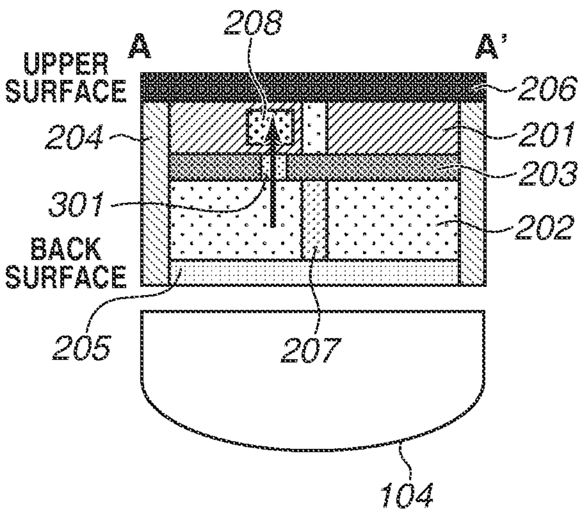
Figure 8C:
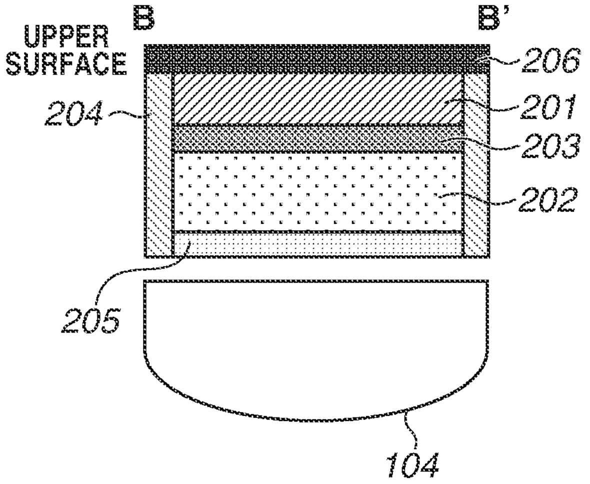
Figure 8D:
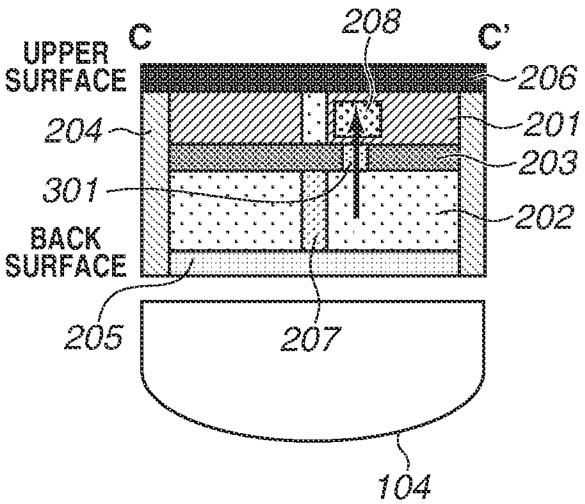

FIGS. 8A to 8D are a plan view and schematic cross-sectional views of one pixel 12 according to the present exemplary embodiment. FIGS. 8B, 8C, and 8D respectively illustrate cross sections taken along corresponding lines indicated in FIG. 8A.

The present exemplary embodiment is different in arrangement of the transport path 301 and the semiconductor region 208 from the first exemplary embodiment. According to the present exemplary embodiment, a configuration is employed with the arrangement of the transport paths 301 and the semiconductor region 208 common to the configuration where the arrangement direction of the semiconductor region 202 is different from that of the semiconductor regions 201 and the configuration where the arrangement direction of the semiconductor regions 202 is the same as that of the semiconductor regions 202, allowing charges to be transferred from the semiconductor regions 202 to the semiconductor regions 201. Thus, regardless of whether the pixels 12 are arranged in the arrangement direction 501 or in the arrangement direction 502, the transport paths 301 and the semiconductor regions 208 are common in configuration.

In order to reduce a potential well, the semiconductor region 208 is arranged at position where the semiconductor region 208 overlap with the transport path 301 in the planar view. The arrangement of the semiconductor region 208 possibly affects the charge movement path, reducing the transfer characteristic.

Figure 9A:
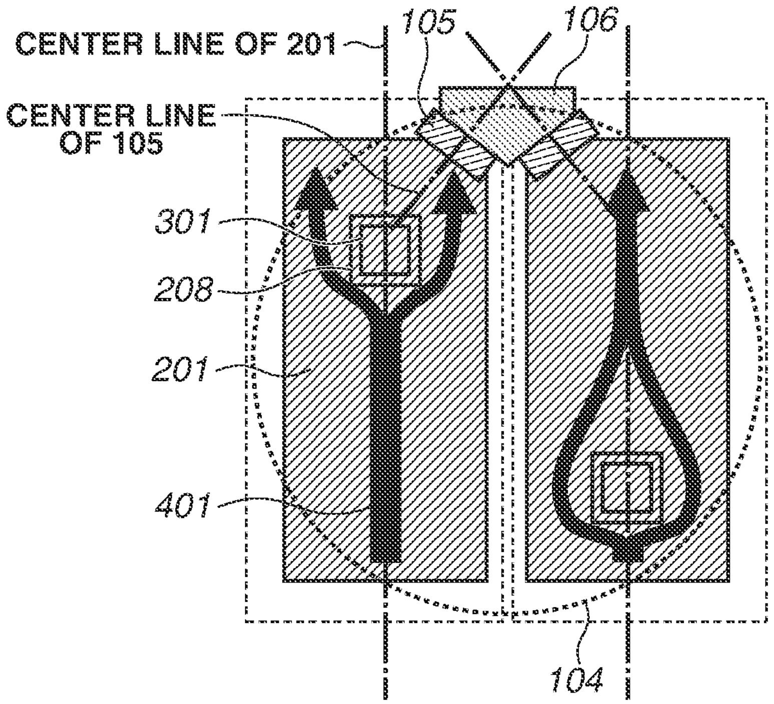
FIGS. 9A and 9B are schematic plan views of pixels in the photoelectric conversion apparatus according to the second exemplary embodiment.
Figure 9B:
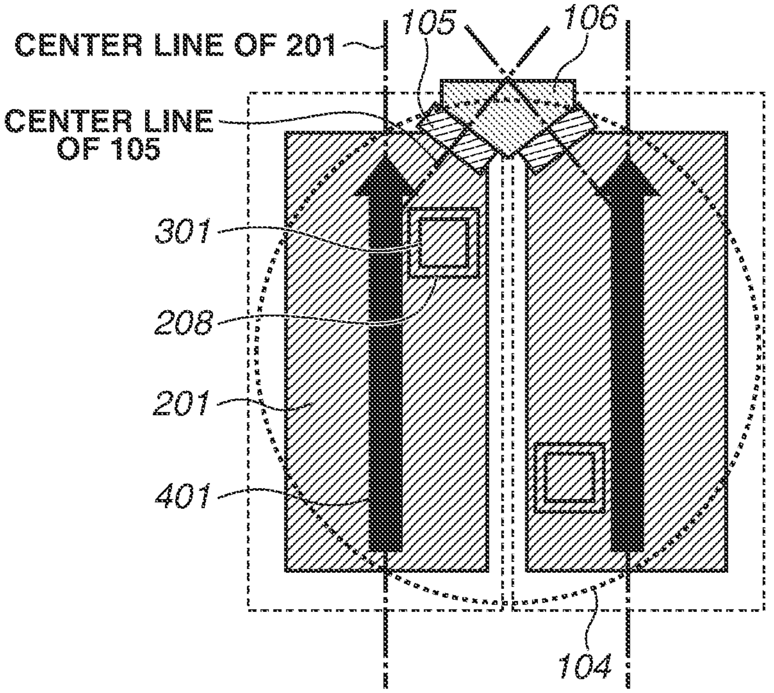

FIGS. 9A and 9B are plan views regarding movement paths of signal charges. FIG. 9A illustrates a comparative example, and FIG. 9B illustrates the present exemplary embodiment. The signal charge accumulated in each semiconductor region 201 is transferred in the direction of the FD 106 if the corresponding transfer gate 105 is turned on. In a case where each semiconductor region 208 is formed with respect to the corresponding transport path 301 so as to reduce a potential well, the potential of each semiconductor region 208 becomes high with respect to the signal charges. Thus, when a signal charge moves in the direction of the FD 106, the signal charge goes around the corresponding semiconductor region 208 to move. This presents a concern of causing a reduced transfer characteristic of the signal charge.

FIG. 9A illustrates an example in which each transport path 301 and the corresponding semiconductor region 208 are arranged on the center line of the corresponding semiconductor region 201, and the signal charge movement path 401. The signal charge movement path 401 in each semiconductor region 201 runs in the direction of the FD 106, but the signal charge movement path 401 goes around the fourth semiconductor region 208 in the way to move in the direction of the FD 106, presenting a concern of causing a reduced transfer characteristic. In FIG. 9B, both each transport path 301 and the corresponding semiconductor region 208 are arranged so as not to overlap with the bisector of the corresponding semiconductor region 201. Thus, it is unlikely that the movement of charges is not obstructed, preventing reduction in the transfer characteristic. As described above, the bisector of each semiconductor region 201 may overlap at least a part of the corresponding semiconductor region 208 in the planar view.

A photoelectrically converted charge moves from the corresponding semiconductor region 202 via the corresponding transport path 301 to the corresponding semiconductor region 201, so that the charge movement path is determined by the position of the transport path 301. Thus, if each transport path 301 is arranged in a region away from the corresponding transfer gate 105, it takes time for charges to move. In order to transfer charges more efficiently from each semiconductor region 202 via the corresponding semiconductor region 201 to the FD 106, it is desirable that the corresponding transport path 301 may be arranged in a region near the corresponding transfer gate 105. Thus, as illustrated in FIG. 9B, it is desirable to arrange each transport path 301 and the corresponding semiconductor region 208 on the side of the corresponding transfer gate 105 arranged in the corresponding semiconductor region 201 divided by the bisector of the semiconductor region 201.

Figure 10:
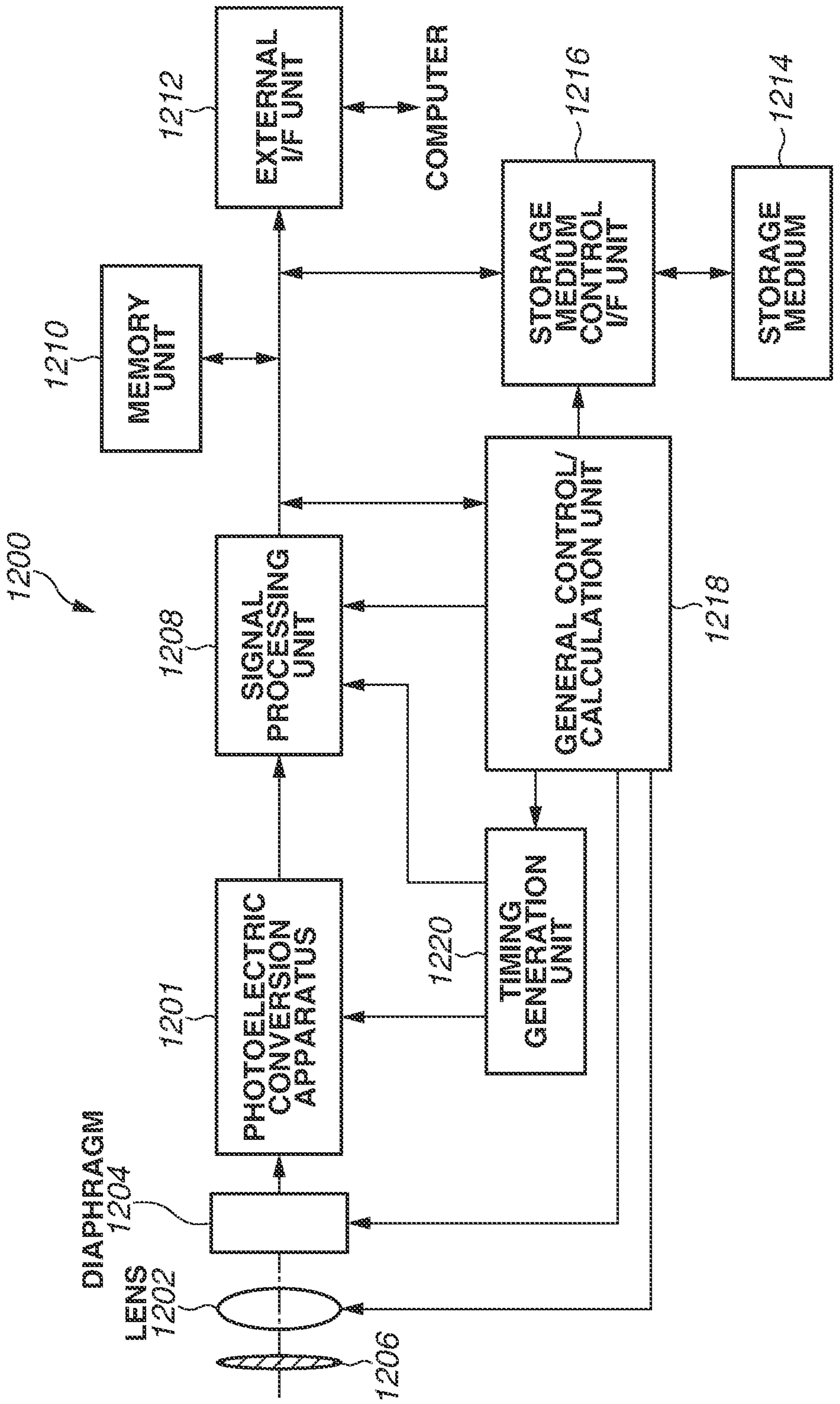
FIG. 10 is a block diagram schematically illustrating the configuration of a photoelectric conversion system according to a third exemplary embodiment.

A photoelectric conversion system according to a third exemplary embodiment will be described with reference to FIG. 10. Like numbers refer to like components of the photoelectric conversion apparatus according to the first and the second exemplary embodiments, and the descriptions thereof will be omitted or simplified. FIG. 10 is a block diagram schematically illustrating the configuration of a photoelectric conversion system according to the present exemplary embodiment.

The photoelectric conversion apparatus described in the above exemplary embodiments can be applied to various photoelectric conversion systems. Examples of applicable photoelectric conversion systems include a digital still camera, a digital camcorder, a surveillance camera, a copying machine, a facsimile machine, a mobile phone, an in-vehicle camera, and an observation satellite.

Further, a camera module equipped with an optical system, such as a lens, and a photoelectric conversion apparatus is also included in the examples of photoelectric conversion systems. FIG. 10 illustrates a block diagram of a digital still camera as an example of the photoelectric conversion systems.

A photoelectric conversion system 1200 illustrated in FIG. 10 includes a photoelectric conversion apparatus 1201 and a lens 1202 that forms an optical image of an object on the photoelectric conversion apparatus 1201. The photoelectric conversion system 1200 further includes a diaphragm 1204 for varying an amount of light passing through the lens 1202 and a barrier 1206 for protecting the lens 1202. The lens 1202 and the diaphragm 1204 constitutes an optical system that focuses light on the photoelectric conversion apparatus 1201. The photoelectric conversion apparatus 1201 is one of the photoelectric conversion apparatuses described in the above-described exemplary embodiments and converts the optical image formed by the lens 1202 into image data.

The photoelectric conversion system 1200 further includes a signal processing unit 1208 that processes an output signal output from the photoelectric conversion apparatus 1201. The signal processing unit or circuit 1208 performs AD conversion to convert an analog signal output by the photoelectric conversion apparatus 1201 into a digital signal. The signal processing unit 1208 also performs various corrections and compression as appropriate to output image data. The AD conversion unit or circuit as a part of the signal processing unit 1208 may be formed on the semiconductor substrate on which the photoelectric conversion apparatus 1201 is mounted or on a semiconductor substrate different from that of the photoelectric conversion apparatus 1201. Further, the photoelectric conversion apparatus 1201 and the signal processing unit 1208 may be formed on a semiconductor substrate.

The photoelectric conversion system 1200 further includes a memory unit 1210 that temporarily stores image data, and an external interface (I/F) unit 1212 that communicates with an external computer and other devices. The photoelectric conversion system 1200 further includes a storage medium 1214, such as a semiconductor memory for recording or reading out captured image data, and a storage medium control interface unit (storage medium control OF unit) 1216 that performs recording or reading on the storage medium 1214. The storage medium 1214 may be built into or may be detachable from the photoelectric conversion system 1200.

The photoelectric conversion system 1200 further includes a general control/calculation unit or circuit 1218 that controls various calculations and the entirety of a digital still camera, and a timing generation unit or circuit 1220 that outputs various timing signals to the photoelectric conversion apparatus 1201 and the signal processing unit 1208. Timing signals may be input from the outside, and it is sufficient that the photoelectric conversion system 1200 includes at least both the photoelectric conversion apparatus 1201 and the signal processing unit 1208 that processes output signals output from the photoelectric conversion apparatus 1201.

The photoelectric conversion apparatus 1201 outputs an imaging signal to the signal processing unit 1208. The signal processing unit 1208 performs predetermined signal processing on the imaging signal output from the photoelectric conversion apparatus 1201 and outputs image data. The signal processing unit 1208 generates an image using the imaging signal.

Application of the photoelectric conversion apparatus according to the above-described exemplary embodiments can realize a photoelectric conversion system that can improve the transfer characteristic and obtain more accurate information.

Figure 11A:
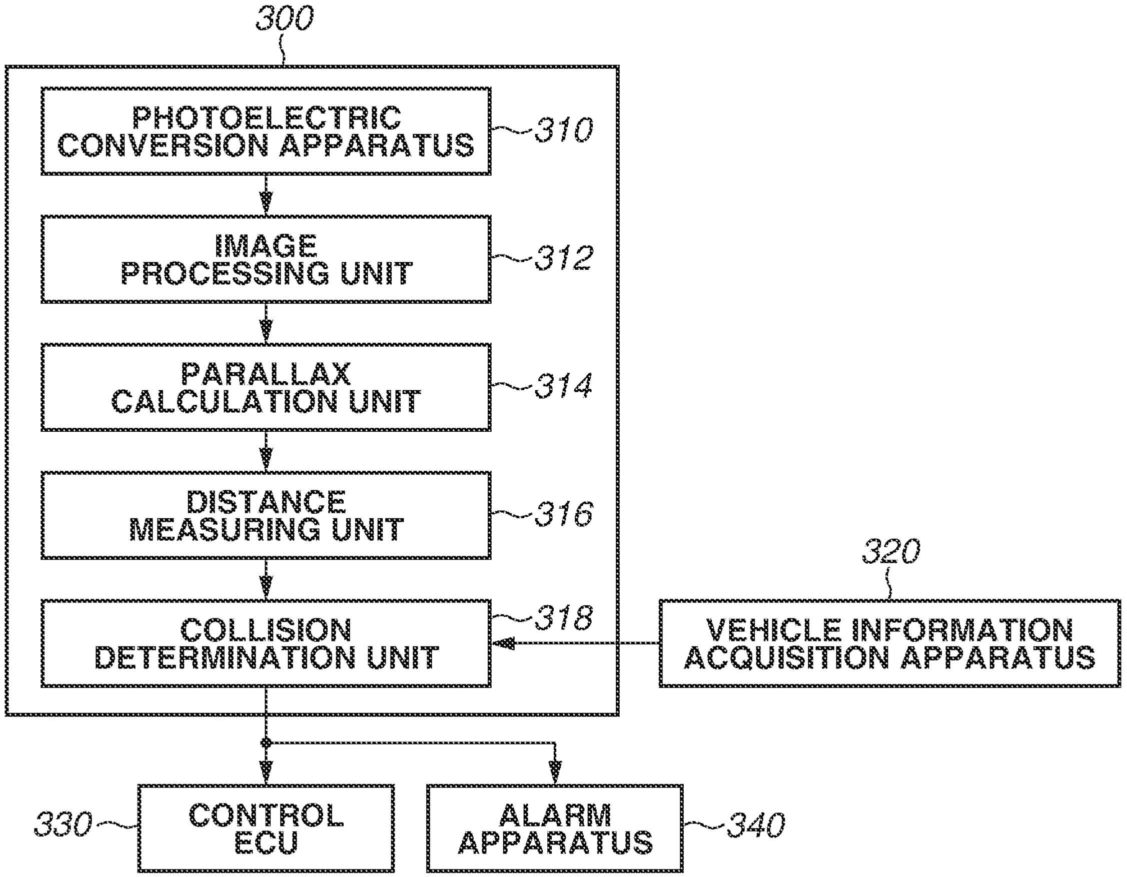
FIGS. 11A and 11B illustrate configuration examples of a photoelectric conversion system and a moving body according to a fourth exemplary embodiment.
Figure 11B:
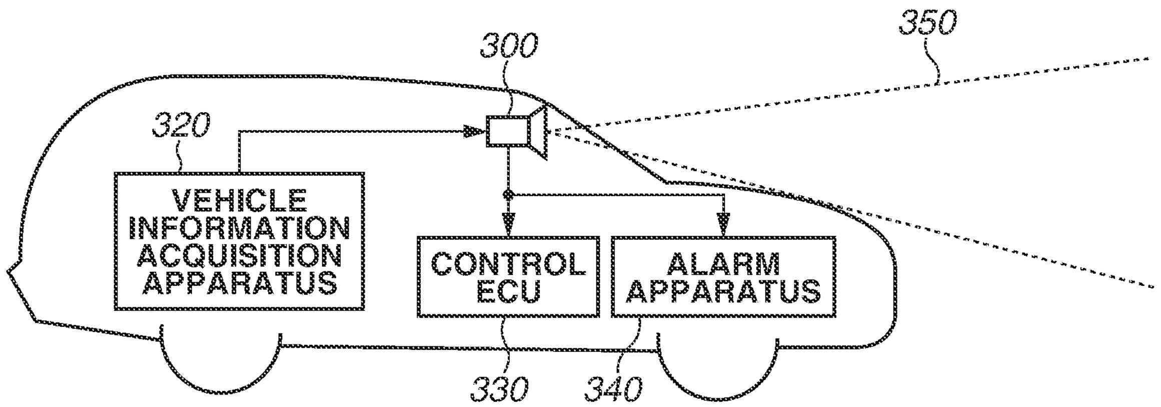

A photoelectric conversion system and a moving body according to a fourth exemplary embodiment will be described with reference to FIGS. 11A and 11B. FIGS. 11A and 11B illustrate configurations of the photoelectric conversion system and the moving body according to the present exemplary embodiment.

FIG. 11A illustrates an example of the photoelectric conversion system related to an in-vehicle camera. A photoelectric conversion system 300 includes a photoelectric conversion apparatus 310. The photoelectric conversion apparatus 310 is the photoelectric conversion apparatus described in any of the above-described exemplary embodiments. The photoelectric conversion system 300 includes an image processing unit 312 that performs image processing on a plurality of pieces of image data acquired by the photoelectric conversion apparatus 310, and a parallax calculation unit 314 that calculates parallax (phase difference of a parallax image) from the plurality of pieces of image data acquired by the photoelectric conversion system 300. The photoelectric conversion system 300 further includes a distance measuring unit or circuit 316 that calculates the distance to a target object based on the calculated parallax, and a collision determination unit or circuit 318 that determines whether there is a likelihood of collision based on the calculated distance. The parallax calculation unit 314 and the distance measuring unit 316 are examples of a distance information acquisition unit that acquires distance information to target objects. More specifically, the distance information is information about, for example, parallax, a defocus amount, and the distance to a target object. The collision determination unit 318 may use any type of the distance information to determine the likelihood of collision. The distance information acquisition unit may be realized with specially designed hardware or with a software module. Further, the distance information acquisition unit may be realized with a field programmable gate array (FPGA), an application specific integrated circuit (ASIC), or a combination thereof.

The photoelectric conversion system 300 is connected to a vehicle information acquisition apparatus 320 and can acquire vehicle information, such as a vehicle speed, a yaw rate, and a steering angle. Further, the photoelectric conversion system 300 is connected to a control electronic control unit (ECU) 330 as a control apparatus that outputs a control signal for generating braking force on the vehicle based on the determination result of the collision determination unit 318. The photoelectric conversion system 300 is also connected to an alarm apparatus 340 that issues an alarm to a driver based on the determination result by the collision determination unit 318. For example, if there is a high likelihood of a collision based on the determination result of the collision determination unit 318, the control ECU 330 performs vehicle control to avoid the collision and reduce damage by applying the brake, releasing the accelerator, or reducing the engine output. The alarm apparatus 340 warns a user by, for example, sounding an alarm, displaying alarm information on the screen of a car navigation system, and/or vibrating the seat belt or the steering wheel.

According to the present exemplary embodiment, the photoelectric conversion system 300 captures images of the surroundings of the vehicle. for example, in front of or behind the vehicle. FIG. 11B illustrates the photoelectric conversion system 300 that capture images in front of the vehicle (an imaging range 350). The vehicle information acquisition apparatus 320 issues instructions to the photoelectric conversion system 300 or the photoelectric conversion apparatus 310. This configuration can further improve the accuracy of distance measurement.

The example of performing control to avoid a collision with another vehicle has been described above, but the photoelectric conversion system can also be applied to automatic driving control that follows another vehicle and automatic driving control that keeps the vehicle within a lane. Further, the photoelectric conversion system can be applied not only to a vehicle, such as its vehicle itself, but also to a moving body (moving apparatus), such as a ship, an aircraft, and an industrial robot. In addition, the photoelectric conversion system can be applied not only to a moving body but also to a wide range of devices that use object recognition, such as intelligent transportation systems (ITS).

Modifications

The disclosure is not limited to the above-described exemplary embodiments, and can be modified in various ways. Specifically, an example of adding a part of the configuration of any of the exemplary embodiments to another exemplary embodiment, and an example of replacing a part of the configuration of any of the exemplary embodiments with that of another exemplary embodiment are also included in the exemplary embodiments' disclosure.

The photoelectric conversion systems according to the third and the fourth exemplary embodiments are examples of the photoelectric conversion systems to which the photoelectric conversion apparatus of the disclosure can be applied, and the photoelectric conversion system to which the photoelectric conversion apparatus of the disclosure can be applied is not limited to the configurations illustrated in FIGS. 10 and 11.

According to the disclosure, a technique is provided that further improves the transfer efficiency of signal charges in a photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-067178, filed Apr. 17, 2023, which is hereby incorporated by reference herein in its entirety.

What is claimed is:

1. A photoelectric conversion apparatus comprising:

a semiconductor layer that includes a first surface and a second surface on an opposite side of the first surface;

at least one first semiconductor region of a first conductivity type between the first surface and the second surface;

at least one second semiconductor region of the first conductivity type between the at least one first semiconductor region and the second surface;

a third semiconductor region of a second conductivity type, which is a conductivity type opposite to the first conductivity type, between the at least one first semiconductor region and the at least one second semiconductor region;

a fourth semiconductor region of the first conductivity type at a depth where the at least one first semiconductor region is arranged and has a lower impurity concentration than an impurity concentration of the at least one first semiconductor region; and a transport path configured to overlap with the at least one first semiconductor region and the at least one second semiconductor region in a planar view and to transport a signal charge generated in the at least one second semiconductor region to the at least one first semiconductor region, wherein, in the planar view, the fourth semiconductor region overlaps with at least a part of the transport path, wherein, in the planar view, the at least one first semiconductor region has a first length in a first direction and a second length longer than the first length in a second direction perpendicular to the first direction, and wherein, in the planar view, a virtual line that divides the at least one first semiconductor region into two halves in the first direction and extends in the second direction is arranged so as not to overlap with the transport path.

2. The photoelectric conversion apparatus according to claim 1, wherein, in the planar view, the virtual line is arranged so as not to overlap with the fourth semiconductor region.

3. The photoelectric conversion apparatus according to claim 1, wherein, in the planar view, the virtual line is arranged to overlap with the fourth semiconductor region.

4. The photoelectric conversion apparatus according to claim 1, further comprising a transfer transistor configured to transfer a charge from the at least one first semiconductor region, wherein, in the planar view, another virtual line that divides a length in a channel width direction of a transfer gate of the transfer transistor into two halves and extends in a direction perpendicular to the channel width direction is arranged so as not to overlap with the transport path.

5. The photoelectric conversion apparatus according to claim 1, further comprising a transfer transistor configured to transfer a charge from the at least one first semiconductor region, wherein, in the planar view, another virtual line that divides a length in a channel width direction of a transfer gate of the transfer transistor into two halves and extends in a direction perpendicular to the channel width direction is arranged so as not to overlap with the fourth semiconductor region.

6. The photoelectric conversion apparatus according to claim 1, further comprising a transfer transistor configured to transfer a charge from the at least one first semiconductor region, wherein, in the planar view, another virtual line that divides a length in a channel width direction of a transfer gate of the transfer transistor into two halves and extends in a direction perpendicular to the channel width direction is arranged to overlap with the fourth semiconductor region.

7. The photoelectric conversion apparatus according to claim 4, wherein the other virtual line intersects with the virtual line.

8. The photoelectric conversion apparatus according to claim 1, further comprising a transfer transistor configured to transfer a charge from the at least one first semiconductor region, wherein, in the planar view, the at least one first semiconductor region is divided by the virtual line into a first region and a second region, wherein the first region is a region near a transfer gate of the transfer transistor, wherein the second region is a region far from the transfer gate, and wherein, in the planar view, the transport path is arranged in the first region.

9. The photoelectric conversion apparatus according to claim 8, wherein, in the planar view, the fourth semiconductor region is arranged in the first region.

10. The photoelectric conversion apparatus according to claim 1, wherein the at least one first semiconductor region comprises a plurality of first semiconductor regions, and wherein a microlens is provided common to one of the first semiconductor regions and another of the first semiconductor regions.

11. The photoelectric conversion apparatus according to claim 9, wherein the at least one first semiconductor region comprises a plurality of the first semiconductor regions, and wherein a microlens is provided common to one of the first semiconductor regions and another of the first semiconductor regions.

12. The photoelectric conversion apparatus according to claim 10, wherein the at least one second semiconductor region comprises a plurality of second semiconductor regions, and wherein the microlens is provided common to one of the second semiconductor regions and another of the second semiconductor regions, wherein the one of the first semiconductor regions and the other of the first semiconductor regions are arranged adjacent to each other in the first direction, and wherein the one of the second semiconductor regions and the other of the second semiconductor regions are arranged adjacent to each other in the second direction.

13. The photoelectric conversion apparatus according to claim 11, wherein the at least one second semiconductor region comprises a plurality of the second semiconductor regions, wherein the common microlens is provided common to one of the second semiconductor regions and another of the second semiconductor regions, wherein the one of the first semiconductor regions and the other of the first semiconductor regions are arranged adjacent to each other in the first direction, and wherein the one of the second semiconductor regions and the other of the second semiconductor regions are arranged adjacent to each other in the second direction.

14. A photoelectric conversion system comprising:

the photoelectric conversion apparatus according to claim 1; and a signal processing unit configured to process a signal output from the photoelectric conversion apparatus.

15. A moving body comprising:

the photoelectric conversion apparatus according to claim 1;

a distance information acquisition unit configured to acquire distance information to a target object from a parallax image based on a signal from the photoelectric conversion apparatus; and a control unit configured to control the moving body based on the distance information.

* * * * *